United States Patent
Liu (10) Patent No.: US 7,768,812 B2
(45) Date of Patent: Aug. 3, 2010

(54) MEMORY CELLS, MEMORY CELL PROGRAMMING METHODS, MEMORY CELL READING METHODS, MEMORY CELL OPERATING METHODS, AND MEMORY DEVICES

(75) Inventor: Jun Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 218 days.

(21) Appl. No.: 12/014,232

(22) Filed: Jan. 15, 2008

(65) Prior Publication Data
US 2009/0180309 A1 Jul. 16, 2009

(51) Int. Cl.
*G11C 11/00* (2006.01)
(52) U.S. Cl. ............... 365/148; 365/115; 365/100; 365/210.12
(58) Field of Classification Search ............ 365/148, 365/115, 100, 210.12
See application file for complete search history.

(56) References Cited

U.S. PATENT DOCUMENTS

| | | | |
|---|---|---|---|
| 6,552,952 B2 | 4/2003 | Pascucci | |
| 6,693,846 B2 | 2/2004 | Fibranz | |
| 6,753,562 B1 | 6/2004 | Hsu et al. | |
| 6,778,421 B2 * | 8/2004 | Tran | 365/105 |
| 6,834,008 B2 | 12/2004 | Rinerson et al. | |
| 6,946,702 B2 | 9/2005 | Jang | |
| 7,050,316 B1 * | 5/2006 | Lin et al. | 365/49.15 |
| 7,085,167 B2 | 8/2006 | Lee et al. | |
| 7,180,160 B2 | 2/2007 | Ferrant et al. | |
| 7,193,267 B2 | 3/2007 | Hsu et al. | |
| 7,236,389 B2 | 6/2007 | Hsu | |
| 2002/0196695 A1 | 12/2002 | Pascucci | |
| 2003/0218929 A1 | 11/2003 | Fibranz | |
| 2005/0205943 A1 | 9/2005 | Yamada et al. | |
| 2005/0269646 A1 | 12/2005 | Yamada | |
| 2006/0062049 A1 | 3/2006 | Lee et al. | |
| 2006/0160304 A1 | 7/2006 | Hsu et al. | |

(Continued)

FOREIGN PATENT DOCUMENTS

WO WO-2006/003620 1/2006

(Continued)

OTHER PUBLICATIONS

Chen, An et al., "Non-Volatile Resistive Switching for Advanced Memory Applications" IEEE, 2005.

(Continued)

*Primary Examiner*—Thong Q Le
(74) *Attorney, Agent, or Firm*—Wells St. John, P.S.

(57) ABSTRACT

Embodiments disclosed include memory cell operating methods, memory cell programming methods, memory cell reading methods, memory cells, and memory devices. In one embodiment, a memory cell includes a wordline, a first bitline, a second bitline, and a memory element. The memory element is electrically connected to the wordline and selectively electrically connected to the first bitline and the second bitline. The memory element stores information via a resistive state of the memory element. The memory cell is configured to convey the resistive state of the memory element via either a first current flowing from the first bitline through the memory element to the wordline or a second current flowing from the wordline through the memory element to the second bitline.

28 Claims, 4 Drawing Sheets

U.S. PATENT DOCUMENTS

| | | |
|---|---|---|
| 2007/0015330 A1 | 1/2007 | Li et al. |
| 2007/0121369 A1 | 5/2007 | Happ |
| 2007/0132049 A1 | 6/2007 | Stipe et al. |
| 2007/0165434 A1 | 7/2007 | Lee et al. |
| 2007/0167008 A1 | 7/2007 | Hsu et al. |
| 2007/0285965 A1* | 12/2007 | Toda et al. ............ 365/148 |

FOREIGN PATENT DOCUMENTS

| | | |
|---|---|---|
| WO | WO 2008/084422 | 3/2009 |

OTHER PUBLICATIONS

Dongsoo et al. "Resistance Switching of Al doped ZnO for Non Volatile Memory Applications" http://ieeexplore.ieee.org/iel5/10846/34184/01629506.pdf?tp=&arnumber=1629506&isnumber=34184.

Hosoi, Y. et al, "High Speed Unipolar Switching Resistance RAM (RRAM) Technology" staff.aist.go.jp/i.inoue/papers/mine/IEDM2006.pdf.

Hudgens, S. and Johnson, B. "Overview of Phase-Change Chalcogenide Nonvolatile Memory Technology" www.mrs.org/publications/bulletin Nov. 2004.

Ignatiev, Alex et al., "Resistance Non-volatile Memory-RRAM" Mater. Res. Soc. Symp. Proc. vol. 997 2007 Materials Research Society.

Kozicki, Michael N. "Memory Devices Based on Solid Electrolytes" Mater. Res. Soc. Symp. Proc. vol. 997, 2007 Materials Research Society.

Oh, J.H., "Full Integration of Highly Manufacturable 512Mb PRAM based on 90nm Technology" 2006 IEEE.

Wuttig, Matthias, "Towards a Universal Memory?" News and Views, Nature Materials, vol. 4, Apr. 2005. www.nature.com/naturematerials.

U.S. Appl. No. 12/141,388 filed Jun.18, 2008: Inventor: Jun Liu.

* cited by examiner

MEMORY CELLS, MEMORY CELL PROGRAMMING METHODS, MEMORY CELL READING METHODS, MEMORY CELL OPERATING METHODS, AND MEMORY DEVICES

TECHNICAL FIELD

Embodiments disclosed herein pertain to memory cells, memory cell programming methods, memory cell reading methods, memory cell operating methods, and memory devices.

BACKGROUND

Resistive random access memories may use a material capable of being configured in one of two different resistive states to store information. When configured in one of the resistive states, the material may have a high resistance to electrical current. In contrast, when configured in the other resistive state, the material may have a low resistance to electrical current. The resistive state in which the material is configured may be changed using electrical signals. For example, if the material is in a high-resistance state, the material may be configured to be in a low-resistance state by applying a voltage across the material.

The resistive state may be persistent. For example, once configured in a resistive state, the material may stay in the resistive state even if neither a current nor a voltage is applied to the material. Furthermore, the configuration of the material may be repeatedly changed from the high resistance state to the low resistance state or from the low resistance state to the high resistance state.

DETAILED DESCRIPTION OF EXAMPLE EMBODIMENTS

Embodiments of the invention encompass memory cell operating methods, memory cell programming methods, memory cell reading methods, memory cells, and memory devices. Example embodiments of such methods, memory cells, and memory devices are described with reference to FIGS. 1-6.

Random access memories may use resistive states of a memory element to store one or more bits of information. For example, a memory element capable of being configured in either a high-resistance state or a low-resistance state may store one bit of information by associating a bit value of "1" with the low-resistance state and a bit value of "0" with the high-resistance state. Alternatively, a bit value of "1" may be associated with the high-resistance state and a bit value of "0" may be associated with the low-resistance state.

The memory element may include a bipolar memory material. A positive voltage applied across the bipolar memory material may change the configuration of the bipolar memory material from a high-resistance state to a low-resistance state. Furthermore, a negative voltage applied across the bipolar memory material may change the configuration of the bipolar memory material from a low-resistance state to a high-resistance state.

Alternatively, a negative voltage applied across the bipolar memory material may change the configuration of the bipolar memory material from a high-resistance state to a low-resistance state and a positive voltage applied across the bipolar memory material may change the configuration of the bipolar memory material from a low-resistance state to a high-resistance. Accordingly, a bipolar memory material may be configured in a first resistive state using a voltage having a first polarity and may be configured in a second resistive state using a voltage having a polarity opposite that of the first polarity.

Examples of bipolar memory material include ionic conducting chalcogenides, binary metal oxides, perovskite oxides, colossal magnetoresistives, and polymers. Example ionic conducting chalcogenides that may be used as bipolar memory material include GeS, GeSe and Ag or Cu-doped GeS and GeSe. Example binary metal oxides that may be used as bipolar memory material include $HfO_x$, $Nb_2O_5$, $Al_2O_3$, WOx, $Ta_2O_5$, $TiO_x$, $ZrO_x$, $Cu_xO$, and $Ni_xO$. Example ionic perovskite oxides that may be used as bipolar memory material include doped or undoped $SrTiO_3$, $SrZrO_3$, $BaTiO_3$.

Example colossal magnetoresistives that may be used as bipolar memory material include $Pr_{1-x}Ca_xMnO_3$ (PCMO), $La_{1-x}Ca_xMnO_3$ (LCMO), and $Ba_{1-x}Sr_xTiO_3$. Example polymers that may be used as bipolar memory material include Bengala Rose, $AlQ_3Ag$, Cu-TCNQ, DDQ, TAPA, and fluorescine-based polymers. Of course, other materials may be used as bipolar memory material. The materials listed above are provided by way of example rather than as an exhaustive list of bipolar memory material.

Figure 1:
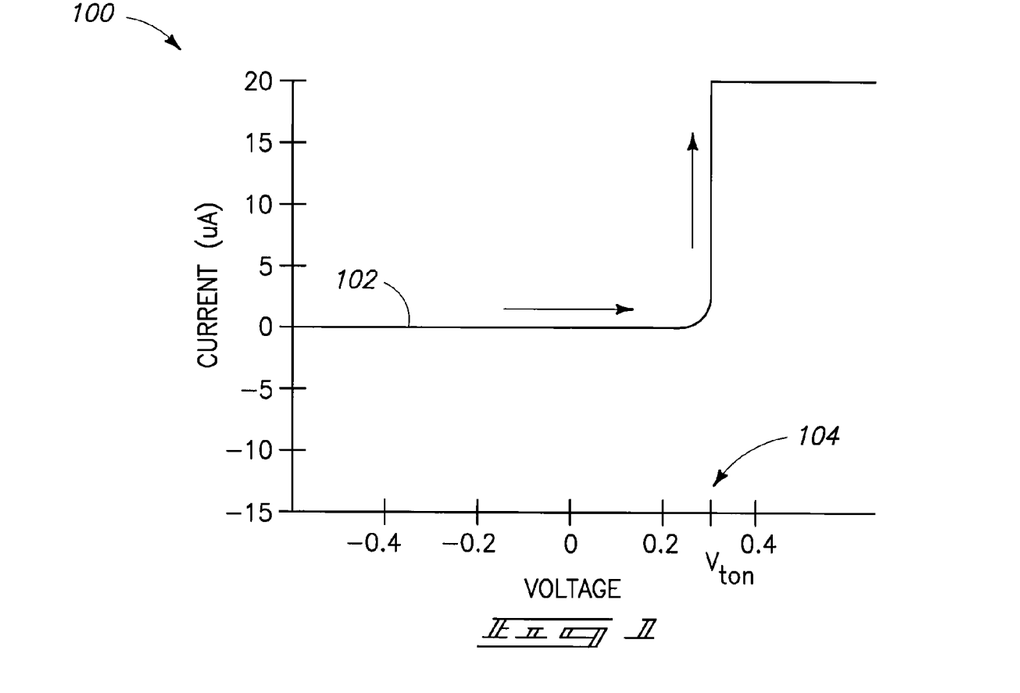
FIG. 1 is a chart illustrating voltage/current relationships.

Referring to FIG. 1, a chart 100 depicts one example of a relationship 102 between voltages applied to a memory element initially in a high-resistance state and currents through the memory element resulting from the voltages. The memory element may comprise one or more of the bipolar memory materials described above. Chart 100 illustrates that as voltages applied to the memory element increase from –0.6 V to 0.2 V, no current, or a negligible amount of current, for example less than 1 micro amp, flows through the memory element. However, at a voltage substantially equal to a turn-on voltage 104, the memory element begins conducting current. As the voltage across the memory element is increased beyond turn-on voltage 104, the amount of current conducted by the memory element increases with the voltage without current clamping. The flattening of the current with voltage depicted in FIG. 1 results from current clamping of a measurement circuit.

Thus, chart 100 illustrates a change in the resistive state of the memory element. Initially, the memory element is in a high-resistance state as evidenced by the fact that the memory element does not conduct current or conducts a negligible amount of current when voltages smaller than the turn-on voltage are applied to the memory element. In this high-resistance state, the memory element may have a resistance of about or above $10^9$ ohms. However, once a voltage greater than or equal to turn-on voltage 104 is applied to the memory element, the memory element configures itself in a low-resistance state as evidenced by the fact that the memory element begins conducting current. In this low-resistance state, the memory element may be highly conductive and have a resistance of about a few thousand ohms.

Figure 2:
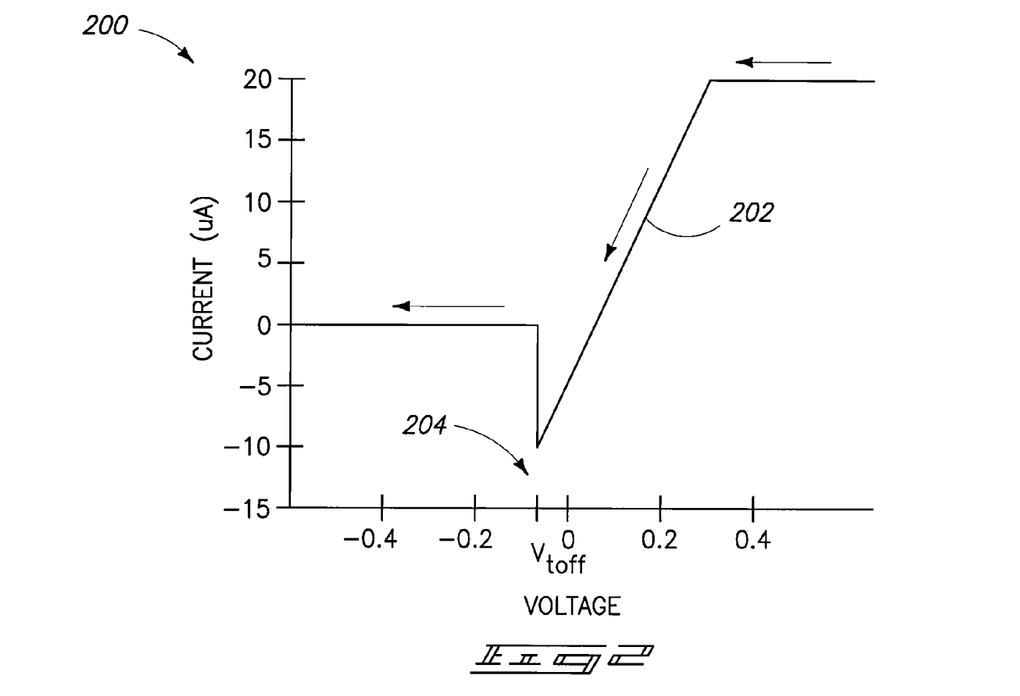
FIG. 2 is chart illustrating other voltage/current relationships.

Referring to FIG. 2, a chart 200 depicts one example of a relationship 202 between voltages applied to a memory element initially in the low-resistance state described above and currents running through the memory element resulting from the voltages. Chart 200 illustrates that currents resulting from voltages greater than about 0.25 V are substantially the same, which results from current clamping of a measurement circuit. Without the current clamping, the current increases with voltage. As the voltage is decreased below about 0.25 V, the current through the memory element accordingly decreases. As the voltage applied across the memory element becomes negative, the current through the memory element is also negative. However, when the voltage applied across the memory element is substantially equal to a turn-off voltage 204, the amount of current through the memory element is substantially zero. As the voltage is further decreased below the turn-off voltage, the current through the memory element remains substantially zero.

Thus, chart 200 illustrates a change in resistive state of the memory element. Initially, the memory element is in the low-resistance state as evidenced by the fact that the memory element conducts current when voltages greater than turn-off voltage 204 are applied to the memory element. However, once a voltage less than or equal to turn-off voltage 204 is applied to the memory element, the memory element configures itself in the high-resistance state described above as evidenced by the fact that the memory element stops conducting current or conducts only a negligible amount of current.

In some cases, once configured in the high-resistance state, the memory element may remain in the high-resistance state as long as a voltage greater than or equal to turn-on voltage 104 is not applied to the memory element. The memory element may remain in the high-resistance state even if no voltage is applied to the memory element. Accordingly, the high-resistance state of the memory element may be described as non-volatile since the high-resistance state might not change over time as long as a voltage greater than or equal to turn-on voltage 104 is not applied to the memory element.

Similarly, in some cases, once configured in the low-resistance state, the memory element may remain in the low-resistance state as long as a voltage less than or equal to turn-off voltage 204 is not applied to the memory element. In fact, the memory element may remain in the low-resistance state even if no voltage is applied to the memory element. Accordingly, the low-resistance state of the memory element may also be described as non-volatile since the low-resistance state might not change over time as long as a voltage less than or equal to turn-off voltage 204 is not applied to the memory element.

Since the high-resistance state and the low-resistance state may be non-volatile, the memory element may be used to store one bit information. For example, a memory element may represent a bit value of "0" when configured in the high-resistance state and may represent a bit value of "1" when configured in the low-resistance state. Furthermore, the resistive state of the memory element may be repeatedly changed over time. Accordingly, the memory element may be in the high-resistance state representing a bit value of "0" at one moment in time and the memory element may be in a low-resistance state representing a bit value of "1" at another moment in time. Similarly, the representation of bit value with resistance states can be the opposite of that described above.

Figure 3:
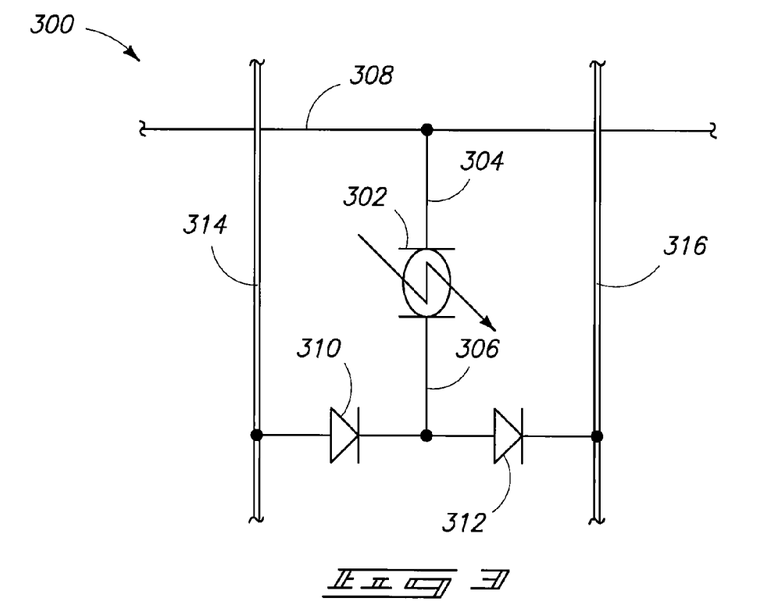
FIG. 3 is a schematic diagram of a memory cell.

Referring to FIG. 3, a memory cell 300 is illustrated. Memory cell 300 includes a memory element 302 having electrodes 306 and 304. Memory element 302 may comprise a bipolar memory material such as one or more of the bipolar memory materials discussed above. Memory cell 300 also includes a wordline 308 and two bitlines 314 and 316. Electrode 304 of memory element 302 is connected to a wordline 308.

Bitline 314 may be selectively electrically connected to memory element 302. For example, a diode 310 may be connected to bitline 314 and to electrode 306. When diode 310 is forward biased (e.g., forward biased beyond a cut-in voltage of diode 310), diode 310 may conduct current from bitline 314 to memory element 302, thereby electrically connecting bitline 314 to memory element 302. In contrast, when diode 310 is not forward biased (e.g., when diode 310 is reverse biased), diode 310 may hinder current from flowing from memory element 302 to bitline 314 or from bitline 314 to memory element 302 so that memory element 302 is not electrically connected to bitline 314.

Similarly, bitline 316 may be selectively electrically connected to memory element 302. For example, a diode 312 may be connected to bitline 316 and to electrode 306. When diode 312 is forward biased (e.g., forward biased beyond a cut-in voltage of diode 312), diode 312 may conduct current from memory element 302 to bitline 316 thereby electrically connecting memory element 302 to bitline 316. In contrast, when diode 312 is not forward biased (e.g., when diode 312 is reverse biased), diode 312 may hinder current from flowing from bitline 316 to memory element 302 or from memory element 302 to bitline 316 so that memory element 302 is not electrically connected to bitline 316.

In some configurations, a memory cell may comprise one or more devices that selectively electrically connect a memory element to a first bitline and/or a second bitline instead of diodes. For example, in one configuration, memory element 300 may use a first transistor in place of diode 310 and a second transistor in place of diode 312. When turned on, the first transistor may allow current to flow between bitline 314 and memory element 302, electrically connecting bitline 314 and memory element 302. When turned off, the first transistor may hinder current from flowing between bitline 314 and memory element 302 thereby electrically disconnecting bitline 314 and memory element 302.

Similarly, the second transistor may selectively electrically connect memory element 302 to bitline 316. Devices other than diodes or transistors may alternatively be used to selectively electrically connect memory element 302 to bitlines 314 and 316.

Memory cell 300 may store a bit of information via a resistive state of memory element 302. In one configuration, the bit may have a value of "0" or a value of "1." For example, according to one convention, if memory element 302 is in a high-resistance state, the value of the bit stored by memory cell 300 may be "0" and if memory element 302 is in a low-resistance state, the value of the bit stored by memory cell 300 may be "1." Of course, a convention in which a high-resistance state represents a bit value of "1" and a low-resistance state represents a bit value of "0" may alternatively be used.

A read operation may be used to determine a value of a bit stored by memory cell 300. According to one read operation, a first positive voltage may be applied between wordline 308 and bitline 316 so that wordline 308 is at a higher potential than bitline 316 and so that diode 312 is forward biased. The first positive voltage may be greater than a cut-in voltage of diode 312 but less than a sum of the cut-in voltage of diode 312 and the turn-off voltage (which was described above in relation to FIG. 2) of memory element 302 so that the resistive state of memory element 302 is not altered. A second positive voltage may be simultaneously applied between wordline 308 and bitline 314 so that wordline 308 is at a higher potential than bitline 314 and so that diode 310 is reverse biased. The second voltage may be lower than a breakdown voltage of diode 310. In some cases, the first voltage and the second voltage may be substantially the same voltage.

If memory element 302 is configured in a low-resistance state, current may flow from wordline 308 through memory element 302 and forward-biased diode 312 to bitline 316. Based on the current, a memory device comprising memory cell 300 may determine that memory element 302 is in a low-resistance state and therefore the value stored by memory cell 300 is a "1." For example, the memory device may compare the current on bitline 316 with a reference current or the memory device may use the current on bitline 316 to create a voltage and may then compare the voltage with a reference voltage.

In contrast, if memory element 302 is configured in a high-resistance state, memory element 302 may hinder current from flowing from wordline 308 through memory element 302 and forward-biased diode 312 to bitline 316. Alternatively, memory element 302 may restrict an amount of current flowing from wordline 308 through memory element 302 and forward-biased diode 312 to bitline 316 to a negligible amount of current that may be clearly distinguished from an amount of current allowed to flow when memory element 302 is in the low-resistance state. Based on the lack of current, or the very small amount of current, the memory device comprising memory cell 300 may determine that memory element 302 is in the high-resistance state and therefore the value stored by memory cell 300 is a "0."

Another method of reading memory cell 300 may alternatively be used. According to this method, a first positive voltage may be applied between bitline 314 and wordline 308 so that bitline 314 is at a higher potential than wordline 308 and so that diode 310 is forward biased. The first positive voltage may be greater than the cut-in voltage of diode 310 but less than a sum of the cut-in voltage of diode 310 and the turn-on voltage (which was described above in relation to FIG. 1) of memory element 302 so that the resistive state of memory element 302 is not altered. A second positive voltage may simultaneously be applied between bitline 316 and wordline 308 so that bitline 316 is at a higher potential than wordline 308 and so that diode 312 is reverse biased. The second voltage may be lower than a breakdown voltage of diode 312. In some cases, the first voltage and the second voltage may be substantially the same voltage.

If memory element 302 is configured in a low-resistance state, current may flow from bitline 314 through forward-biased diode 310 and memory element 302 to wordline 308. Based on the current on wordline 308, a memory device comprising memory cell 300 may determine that memory element 302 is in a low-resistance state and therefore the value stored by memory cell 300 is a "1."

In contrast, if memory element 302 is configured in a high-resistance state, memory element 302 may hinder current from flowing from bitline 314 through forward-biased diode 310 and memory element 302 to wordline 308. Alternatively, memory element 302 may restrict an amount of current flowing from bitline 314 through forward-biased diode 310 and memory element 302 to wordline 308 to a negligible amount that may be clearly distinguished from an amount of current allowed to flow when memory element 302 is in the low-resistance state. Based on the lack of current, or the very small amount of current, the memory device comprising memory cell 300 may determine that memory element 302 is in the high-resistance state and therefore the value stored by memory cell 300 is a "0."

In addition to reading a bit value from memory cell 300, a bit value may be written to memory cell 300. To write a bit value of "1" to memory cell 300, a first positive voltage may be applied between bitline 314 and wordline 308 so that bitline 314 is at a higher potential than wordline 308 and so that diode 310 is forward biased. The first positive voltage may be greater than a sum of the cut-in voltage of diode 310 and the turn-on voltage of memory element 302. If memory element 302 is in a high-resistance state, the first voltage (or a current resulting from the first voltage) may re-configure memory element 302 to be in a low-resistance state. If memory element 302 is already in a low-resistance state, memory element 302 may remain in the low-resistance state. Consequently, due to the first voltage, memory element 302 may be configured in a low-resistance state corresponding with a bit value of "1."

A second positive voltage may be applied simultaneously with the first voltage. The second positive voltage may be applied between bitline 316 and wordline 308 so that bitline 316 is at a higher potential than wordline 308 and so that diode 312 is reverse biased. The second voltage may hinder current from flowing from bitline 314 to bitline 316. The second voltage may be lower than a breakdown voltage of diode 312.

The first voltage may result from a first voltage pulse and the second voltage may result from a second voltage pulse. In some cases, the first voltage and the second voltage may be substantially the same voltage.

Alternatively, a bit value of "0" may be written to memory cell 300. To write a bit value of "0" to memory cell 300, a first positive voltage may be applied between wordline 308 and bitline 316 so that wordline 308 is at a higher potential than bitline 316 and so that diode 312 is forward biased. The first positive voltage may be greater than a sum of the cut-in voltage of diode 312 and the turn-off voltage of memory element 302. If memory element 302 is in a low-resistance state, the first voltage (or a current resulting from the first voltage) may re-configure memory element 302 to be in a high-resistance state. If memory element 302 is already in a high-resistance state, memory element 302 may remain in the high-resistance state. Consequently, due to the first voltage, memory element 302 may be configured in a high-resistance state corresponding with a bit value of "0."

A second positive voltage may be applied simultaneously with the first voltage. The second positive voltage may be applied between wordline 308 and bitline 314 so that wordline 308 is at a higher potential than bitline 314 and so that diode 310 is reverse biased. The second voltage may hinder current from flowing from bitline 316 to bitline 314. The second voltage may be lower than a breakdown voltage of diode 310.

The first voltage may result from a first voltage pulse and the second voltage may result from a second voltage pulse. In some cases, the first voltage and the second voltage may be substantially the same voltage.

The methods of writing a "0" and writing a "1" to memory cell 300 may be repeatedly used so that memory cell 300 stores different bit values over time. In some cases, memory element 302 may be re-written using these methods millions of times without damaging memory element 302. Since memory element 302 may remain in a resistive state without a voltage or current being applied to memory element 302 as was discussed above in relation to FIG. 1, memory element 302 may be said to preserve a bit value in a non-volatile manner. Accordingly, memory cell 300 may store a bit of information without having to be frequently refreshed or memory cell 300 may be refreshed at a rate lower than a rate used to refresh a volatile memory cell.

Figure 4:
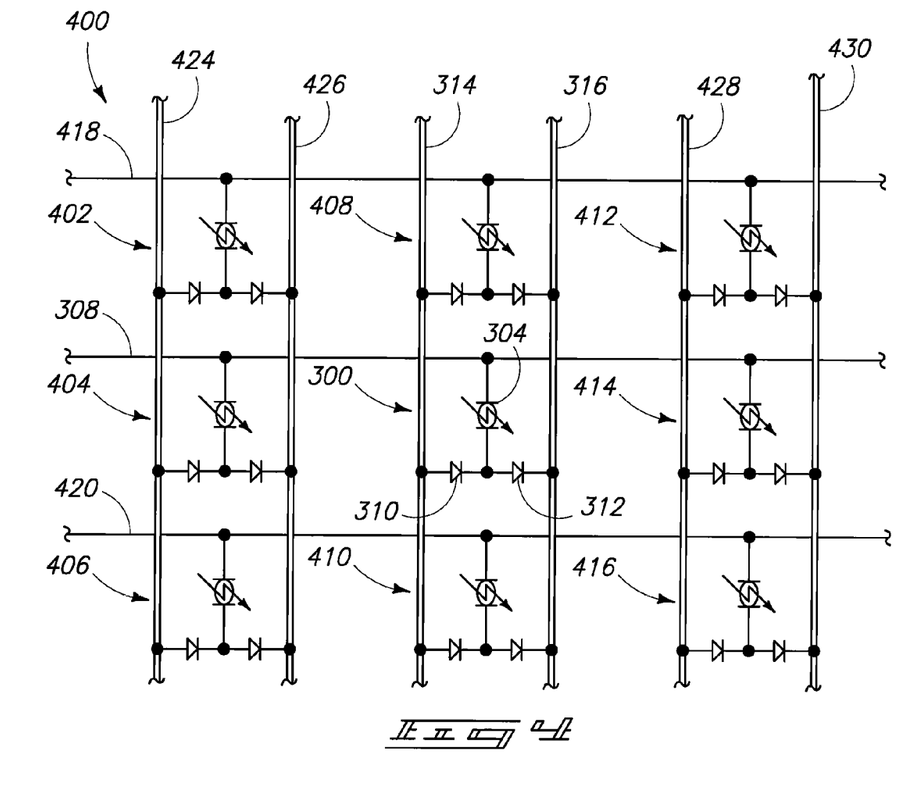
FIG. 4 is a schematic diagram of a memory device.

Referring to FIG. 4, a schematic diagram 400 of a portion of a memory device is illustrated. The memory device includes memory cell 300 as well as additional memory cells 402, 404, 406, 408, 410, 412, 414, and 416. The memory device may store a plurality of bits. For example, the memory device may store one bit in each memory cell of the memory device.

The memory cells of the memory device may be arranged to share bitlines and wordlines. In diagram 400, memory cells 402, 408, and 412 share wordline 418; memory cells 404, 300, and 414 share wordline 308; and memory cells 406, 410, and 416 share wordline 420. Furthermore, in diagram 400, memory cells 402, 404, and 406 share bitlines 424 and 426; memory cells 408, 300, and 410 share bitlines 314 and 316; and memory cells 412, 414, and 416 share bitlines 428 and 430.

Figure 5:
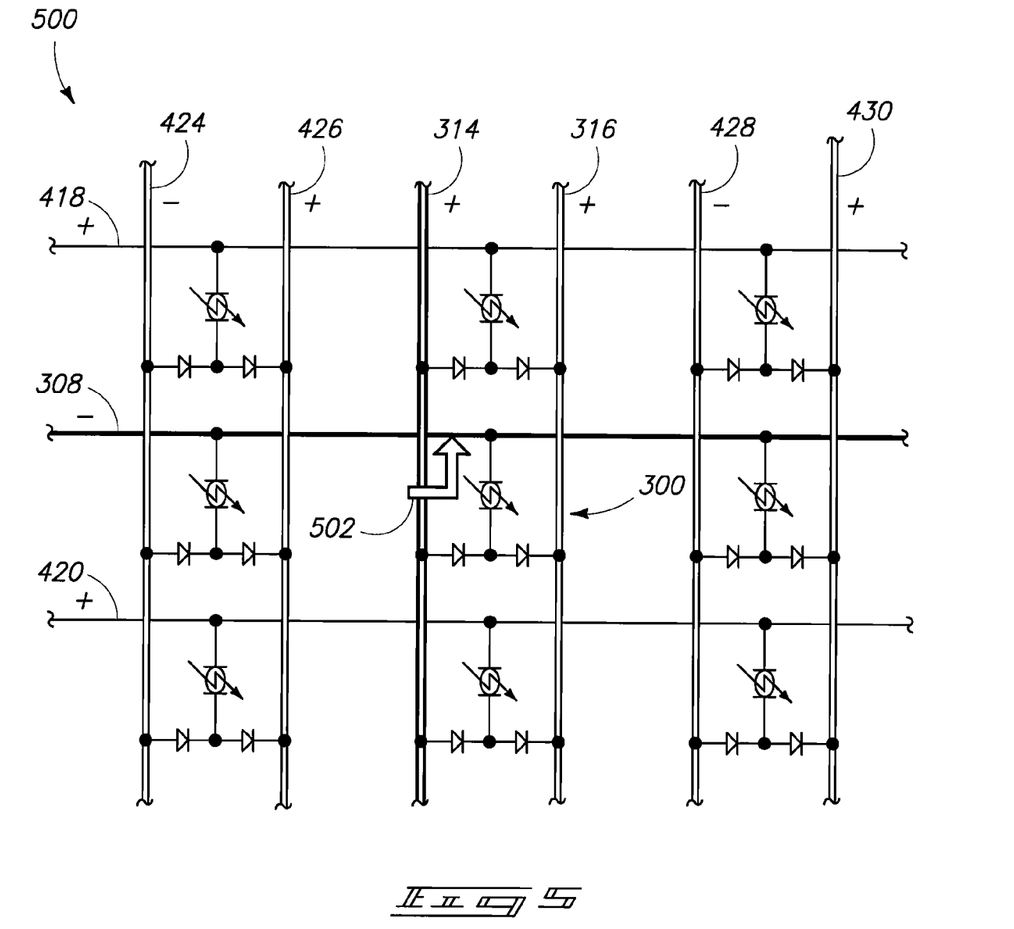
FIG. 5 is a schematic diagram of a memory device illustrating a current.

Referring to FIG. 5, a schematic diagram 500 illustrating a configuration of the memory device of FIG. 4 is illustrated. The configuration may be used to write a bit value of "1" to memory cell 300 or to read a bit of information from memory cell 300. According to the configuration, a first positive voltage is applied across bitline 314 and wordline 308. A second positive voltage is applied across bitline 316 and wordline 308. Consequently, a current may flow from bitline 314 through memory cell 300 to wordline 308 as illustrated by arrow 502 and as was described above in relation to FIG. 3. If the first voltage is greater than a sum of the cut-in voltage of diode 310 and the turn-on voltage of memory element 302, a "1" may be written to memory cell 300 as was described above in relation to FIG. 3.

Alternatively, if the first voltage is greater than the cut-in voltage of diode 310 but less than a sum of the cut-in voltage of the diode and the turn-on voltage of memory element 302, the memory device may determine the value of a bit stored by memory cell 300 based on a current flowing from bitline 314 to wordline 308 as was described above in relation to FIG. 3.

It may be desirable to ensure that values stored by memory cells 402, 404, 406, 408, 410, 412, 414, and 416 are not disturbed while writing or reading memory cell 300. To avoid disturbances, bitlines and wordlines of the memory device may be configured with particular voltages.

For example, when writing a "1" into memory cell 300, bitlines 314 and 316 may be at a higher potential than wordline 308. Since memory cells 408 and 410 are also connected to bitlines 314 and 316, wordlines 418 and 420 may be configured to be at substantially the same potential as bitlines 314 and 316 to hinder current from flowing from bitline 314 and/or bitline 316 to wordline 418 and/or wordline 420.

Furthermore, it may be desirable to hinder currents from flowing from memory cells 404 and 414 onto wordline 308 so that a current on wordline 308 may be correctly attributed to memory cell 300. To do so, bitlines 424 and 428 may be configured to be at substantially the same potential as wordline 308 to hinder current from flowing from bitline 424 to wordline 308 via memory cell 404 and to hinder current from flowing from bitline 428 to wordline 308 via memory cell 414. In addition, bitlines 426 and 430 may be configured at a higher potential than wordline 308 so that current is hindered from flowing from bitline 426 through memory cell 404 to wordline 308 and from bitline 430 through memory cell 414 to wordline 308.

Other memory cells not connected to either wordline 308 or bitlines 314 and 316 (i.e., memory cells 402, 406, 412, and 416) may be configured to hinder consumption of current. For example, bitlines 424 and 426 and wordlines 418 and 420 may be configured with voltages causing the diodes of memory cells 402 and 406 to be reverse biased. Similarly, bitlines 428 and 430 and wordlines 418 and 420 may be configured with voltages causing the diodes of memory cells 412 and 416 to be reverse biased.

Figure 6:
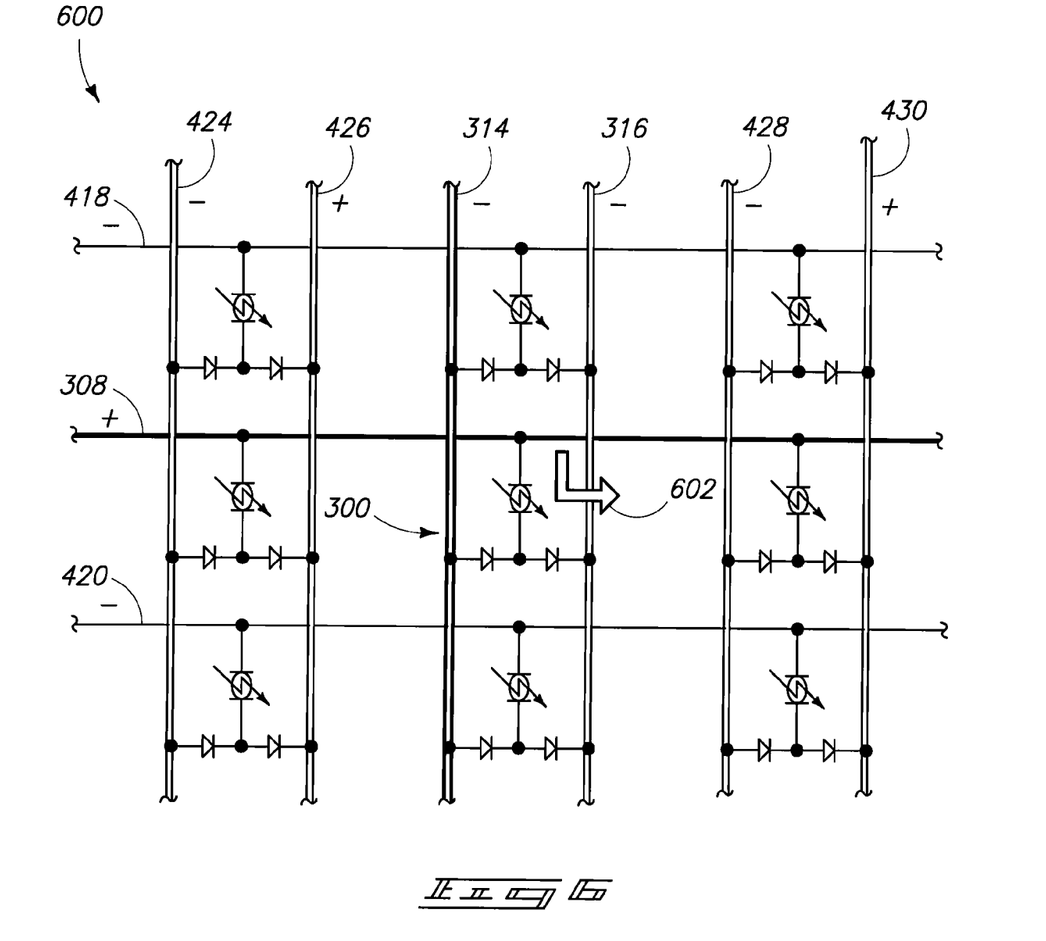
FIG. 6 is a schematic diagram of a memory device illustrating another current.

Referring to FIG. 6, a schematic diagram 600 illustrating a configuration of the memory device of FIG. 4 is illustrated. The configuration may be used to write a bit value of "0" to memory cell 300 or to read a bit of information from memory cell 300. According to the configuration, a first positive voltage is applied across wordline 308 and bitline 316. A second positive voltage is applied across wordline 308 and bitline 314. Consequently, a current may flow from wordline 308 through memory cell 300 to bitline 316 as indicated by arrow 602 and as was described above in relation to FIG. 3. If the first voltage is greater than a sum of the cut-in voltage of diode 312 and the turn-off voltage of memory element 302, a "0" may be written to memory cell 300 as was described above in relation to FIG. 3.

Alternatively, if the first voltage is greater than the cut-in voltage of diode 312 but less than a sum of the cut-in voltage of diode and the turn-off voltage of memory element 302, the memory device may determine the value of a bit stored by memory cell 300 based on a current flowing from wordline 308 to bitline 316 as was described above in relation to FIG. 3.

It may be desirable to ensure that values stored by memory cells 402, 404, 406, 408, 410, 412, 414, and 416 are not disturbed while writing or reading memory cell 300. To avoid disturbances, bitlines and wordlines of the memory device may be configured with particular voltages.

For example, when writing a "0" into memory cell 300, bitlines 314 and 316 may be at a lower potential than wordline 308. Since memory cells 408 and 410 are also connected to bitlines 314 and 316, wordlines 418 and 420 may be configured to be at substantially the same potential as bitlines 314 and 316 to hinder current from flowing from wordline 418 and/or wordline 420 to bitline 314 and/or bitline 316.

Furthermore, it may be desirable to hinder currents from flowing from wordline 308 into memory cells 404 and 414. To do so, bitlines 426 and 430 may be configured to be at substantially the same potential as wordline 308 to hinder current from flowing from wordline 308 to bitline 426 via memory cell 404 and to hinder current from flowing from wordline 308 to bitline 430 via memory cell 414. In addition, bitlines 424 and 428 may be configured at a lower potential than wordline 308 so that current is hindered from flowing from bitline 424 to wordline 308 through memory cell 404 and from bitline 428 to wordline 308 through memory cell 414.

Other memory cells not connected to either wordline 308 or bitlines 314 and 316 (i.e., memory cells 402, 406, 412, and 416) may be configured to hinder consumption of current as is illustrated in FIG. 6. For example, bitlines 424 and 428 may be configured at the same potential as wordlines 418 and 420 to hinder current from flowing through left-hand diodes of memory cells 402, 406, 412, and 416. Furthermore, bitlines 426 and 430 and wordlines 418 and 420 may be configured to reverse bias right-hand diodes of memory cells 402, 406, 412, and 416.

The above discussion has assumed that memory element 302 is configured so that memory element 302 changes to a low-resistance state when a voltage greater than the turn-on voltage of memory element 302 is applied between electrodes 306 and 304 so that electrode 306 is at a higher potential than electrode 304. Similarly, the above discussion has assumed that memory element 302 changes to a high-resistance state when a voltage greater than the turn-off voltage of memory element 302 is applied across electrodes 304 and 306 so that electrode 304 is at a higher potential than electrode 306.

However, memory element 302 may be reversed so that memory element 302 changes to a high-resistance state when a voltage greater than the turn-off voltage of memory element 302 is applied between electrodes 306 and 304 so that electrode 306 is at a higher potential than electrode 304. In this configuration, memory element 302 may change to a low-resistance state when a voltage greater than the turn-on voltage of memory element 302 is applied across electrodes 304 and 306 so that electrode 304 is at a higher potential than electrode 306.

Furthermore, the above discussion has assumed that a high-resistance state of memory element 302 corresponds to a bit value of "0" and that a low-resistance state of memory element 302 corresponds to a bit value of "1." However, as was mentioned above, memory devices may be constructed based on an understanding that the high-resistance state of memory element 302 corresponds to a bit value of "1" and that the low-resistance state of memory element 302 corresponds to a bit value of "0" without changing the principles of writing and reading memory cell 300.

The above discussion has referred to a memory element having a high resistance state and a low resistance state. However, in some embodiments of the invention, a memory element may be configurable in more than two different resistive states. Such a memory element may store more than one bit of information and may be used in a memory cell such as memory cell 300. Each of a plurality of different programming voltages may correspond to a different one of a plurality of different resistive states of the memory element.

The methods of programming memory cell 300 described above may be adapted to program a memory element having more than one resistive state by applying one of the plurality of programming voltages to the memory element in order to configure the memory element in the resistive state corresponding to the applied programming voltage. Furthermore, the methods of reading memory cell 300 described above may be adapted to read the memory element by comparing a current resulting from a voltage applied to the memory element to a plurality of different reference currents to determine in which of the plurality of different resistive states the memory cell is configured.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
a wordline;
a first bitline;
a second bitline; and
a memory element electrically connected to the wordline and selectively electrically connected to the first bitline and to the second bitline, the memory element storing information via a resistive state of the memory element;
wherein the memory cell is configured to convey the resistive state of the memory element via a first current flowing from the first bitline through the memory element to the wordline and is configured to convey the resistive state of the memory element via a second current flowing from the wordline through the memory element to the second bitline.

2. The memory cell of claim 1 wherein:
the memory cell further comprises a first diode and a second diode;
the memory element comprises a first electrode connected to the first bitline via the first diode and to the second bitline via the second diode and a second electrode connected to the wordline; and
the memory element is electrically connected to the first bitline via the first diode when the first diode is forward biased and is electrically disconnected from the first bitline when the first diode is not forward biased; and
the memory element is electrically connected to the second bitline via the second diode when the second diode is forward biased and is electrically disconnected from the second bitline when the second diode is not forward biased.

3. The memory cell of claim 1 wherein the memory element comprises at least one of an ionic conducting chalcogenide, a binary metal oxide, a perovskite oxide, a colossal magnetoresistive, or a polymer.

4. The memory cell of claim 1 wherein the memory element is configured to store the information in a non-volatile manner in the absence of a voltage or a current.

5. The memory cell of claim 1 further comprising:
a first diode connecting the first bitline to the memory element, the first diode being configured to conduct the first current when the first diode is forward biased; and
a second diode connecting the second bitline to the memory element, the second diode being configured to conduct the second current when the second diode is forward biased.

6. A memory cell programming method comprising:
providing a memory cell comprising a wordline, first and second bitlines, and a memory element, the memory element being electrically connected to the wordline and selectively electrically connected to the first and second bitlines;
using the memory element, storing information via a first resistive state of the memory element;
applying a first voltage across the second bitline and the wordline effective to electrically disconnect the second bitline from the memory element; and
applying a second voltage across the first bitline and the wordline effective to electrically connect the first bitline to the memory element and to configure the memory element in a different second resistive state, the first bitline being at a higher potential than the wordline during the applying of the second voltage.

7. The method of claim 6 further comprising:
providing a first diode connected to a first electrode of the memory element and to the first bitline;
providing a second diode connected to the first electrode of the memory element and to the second bitline, the second diode being reverse biased due to the first voltage and the first voltage being less than a breakdown voltage of the second diode; and
wherein:
a second electrode of the memory element is connected to the wordline;
the memory element is highly conductive of current between the second electrode and the first electrode when the memory element is in the first resistive state; and the memory element is highly resistive of current between the second electrode and the first electrode when the memory element is in the second resistive state.

8. The method of claim 7 wherein the applied second voltage is greater than a sum of a turn-off voltage of the memory element and a cut-in voltage of the first diode.

9. The method of claim 6 wherein the applied first voltage is substantially the same as the applied second voltage.

10. The method of claim 6 further comprising subsequent to the applying of the first voltage and the applying of the second voltage:
applying a third voltage across the first bitline and the wordline effective to electrically disconnect the first bitline from the memory element; and
applying a fourth voltage across the wordline and the second bitline effective to electrically connect the second bitline to the memory element and to configure the memory element in the first resistive state.

11. The method of claim 10 wherein the applied third voltage is substantially the same as the applied fourth voltage.

12. A memory cell reading method comprising:
providing a memory cell comprising a wordline, first and second bitlines, and a memory element electrically connected to the wordline and selectively electrically connected to the first and second bitlines, the memory element being disposed to be selectively configured in any of a plurality of different resistive states;
applying a first voltage across the wordline and the first bitline effective to electrically disconnect the first bitline from the memory element, the wordline being at a higher potential than the first bitline during the applying of the first voltage;
applying a second voltage across the wordline and the second bitline effective to cause a current to flow from the wordline through the memory element to the second bitline; and
based on the current, determining that the memory element is configured in a particular one of the plurality of different resistive states.

13. The method of claim 12 wherein the particular one of the plurality of different resistive states is associated with a value of a bit of information.

14. The method of claim 12 wherein the memory element is disposed to be selectively configured in either a high resistance state or a low resistance state.

15. The method of claim 12 further comprising:
providing a first diode connected to a first electrode of the memory element and to the first bitline; and
providing a second diode connected to the first electrode of the memory element and to the second bitline;
wherein the applied second voltage is greater than a cut-in voltage of the second diode but less than a sum of the cut-in voltage of the second diode and a turn-off voltage of the memory element and the memory element comprises a second electrode connected to the wordline.

16. The method of claim 12 wherein the determining comprises comparing the current to a reference current.

17. The method of claim 12 wherein the determining comprises determining that the current is very small or immeasurable and that the memory element is in a high resistance state.

18. A memory device comprising:
a first bitline;
a second bitline;
a memory element disposed to be selectively and reversibly configured in one of two different resistive states;
a first diode connecting the first bitline to a first electrode of the memory element;
a second diode connecting the second bitline to the first electrode of the memory element; and
a wordline connected to a second electrode of the memory element.

19. The device of claim 18 wherein the first diode is configured to conduct current from the first bitline to the first electrode when the first diode is forward biased and the second diode is configured to conduct current from the first electrode to the second bitline when the second diode is forward biased.

20. The device of claim 18 wherein the memory element comprises a first memory element, the wordline comprises a first wordline, and the memory device further comprises:
a second memory element disposed to be selectively and reversibly configured in one of two different resistive states;
a second wordline connected to a second electrode of the second memory element;
a third diode connected between the first bitline and a first electrode of the second memory element; and
a fourth diode connected between the second bitline and the first electrode of the second memory element.

21. The device of claim 20 wherein the memory device is configured to:
convey the resistive state of the first memory element via a first current flowing from the first wordline through the first memory element to the second bitline; and
hinder a second current from flowing from the second wordline through the second memory element to the second bitline while the resistive state of the first memory element is being conveyed by the first current.

22. The device of claim 20 wherein the memory device is configured to:
change the resistive state of the first memory element via a first voltage between the first bitline and the first wordline; and
hinder a second voltage between the first bitline and the second wordline from changing the resistive state of the second memory element while the first voltage is being applied between the first bitline and the first wordline.

23. The device of claim 18 wherein:
the second electrode of the memory element is directly connected to the wordline;
the first electrode of the memory element is directly connected to a first electrode of the first diode;
a second electrode of the first diode is directly connected to the first bitline;
the first electrode of the memory element is directly connected to a first electrode of the second diode; and
a second electrode of the second diode is directly connected to the second bitline.

24. The device of claim 23 wherein the first electrode of the first diode is a cathode of the first diode and the first electrode of the second diode is an anode of the second diode.

25. A memory cell operating method comprising:
providing a memory cell comprising a wordline, first and second bitlines, a memory element, and first and second diodes, the memory element being electrically connected to the wordline and selectively electrically connected to the first bitline via the first diode when the first diode is forward biased and selectively electrically connected to the second bitline via the second diode when the second diode is forward biased;

applying a first voltage across the wordline and the first bitline effective to electrically disconnect the first bitline from the memory element;

while the first voltage is being applied, applying a second voltage across the wordline and the second bitline effective to electrically connect the second bitline to the memory element and to configure the memory element in a high resistance state;

while the first voltage is being applied but the second voltage is not being applied, applying a third voltage across the wordline and the second bitline;

determining, based on a lack of current flowing from the wordline through the memory element and the second diode to the second bitline, that the memory element is configured in the high resistance state;

applying a fourth voltage across the second bitline and the wordline effective to electrically disconnect the second bitline from the memory element;

while the fourth voltage is being applied, applying a fifth voltage across the first bitline and the wordline effective to electrically connect the first bitline to the memory element and to configure the memory element in a low resistance state;

while the first voltage is being applied but the second voltage is not being applied and subsequent to the memory element being configured in the low resistance state, applying the third voltage across the wordline and the second bitline effective to cause a current to flow from the wordline through the memory element and the second diode to the second bitline; and based on the current, determining that the memory element is configured in the low resistance state.

26. The method of claim 25 wherein the applied second voltage is larger than the third voltage.

27. The method of claim 25 wherein the memory element comprises at least one of an ionic conducting chalcogenide, a binary metal oxide, a perovskite oxide, a colossal magnetoresistive, or a polymer.

28. The method of claim 25 wherein the applied third voltage is greater than a cut-in voltage of the second diode but less than a sum of the cut-in voltage of the second diode and a turn-off voltage of the memory element.

* * * * *